(12) United States Patent
Chen et al.

(10) Patent No.: US 10,677,833 B2
(45) Date of Patent: Jun. 9, 2020

(54) ELECTROMIGRATION MONITOR

(71) Applicant: INTERNATIONAL BUSINESS MACHINES CORPORATION, Armonk, NY (US)

(72) Inventors: Fen Chen, Williston, VT (US); Mukta G. Farooq, Hopewell Junction, VT (US); John A. Griesemer, Salt Point, NY (US); Chandrasekaran Kothandaraman, Hopewell Junction, NY (US); John M. Safran, Wappingers Falls, NY (US); Timothy D. Sullivan, Underhill, VT (US); Ping-Chuan Wang, Hopewell Junction, NY (US); Lijuan Zhang, Beacon, NY (US)

(73) Assignee: International Business Machines Corporation, Armonk, NY (US)

(*) Notice: Subject to any disclaimer, the term of this patent is extended or adjusted under 35 U.S.C. 154(b) by 67 days.

(21) Appl. No.: 15/805,406

(22) Filed: Nov. 7, 2017

(65) Prior Publication Data
US 2018/0074111 A1   Mar. 15, 2018

Related U.S. Application Data

(63) Continuation of application No. 14/320,598, filed on Jun. 30, 2014, now Pat. No. 9,891,261.

(51) Int. Cl.
| H01L 21/66 | (2006.01) |
| G01R 31/08 | (2020.01) |
| H01L 23/48 | (2006.01) |
| G01R 31/28 | (2006.01) |

(52) U.S. Cl.
CPC .......... *G01R 31/08* (2013.01); *G01R 31/2858* (2013.01); *H01L 22/34* (2013.01); *H01L 23/481* (2013.01); *G01R 31/2856* (2013.01); *H01L 22/14* (2013.01); *H01L 2924/0002* (2013.01)

(58) Field of Classification Search
None
See application file for complete search history.

(56) References Cited

U.S. PATENT DOCUMENTS

| 7,851,237 B2 | 12/2010 | Wolfgang |
| 8,253,423 B2 | 8/2012 | Lee et al. |
| 8,304,863 B2 | 11/2012 | Filippi et al. |
| 8,362,622 B2 | 1/2013 | Sproch et al. |
| 9,891,261 B2 * | 2/2018 | Chen ............... H01L 23/481 |
| 2004/0036495 A1 | 2/2004 | Fazekas et al. |

(Continued)

OTHER PUBLICATIONS

T. Karnik et al., "Microprocessor system applications and challenges for through-silicon-via-based three-dimensional integration," IET Computers & Digital Techniques, vol. 5, No. 3, 2011, pp. 205-212.

(Continued)

*Primary Examiner* — Jack S Chen
(74) *Attorney, Agent, or Firm* — ZIP Group PLLC

(57) ABSTRACT

A structure, such as a wafer, semiconductor chip, integrated circuit, or the like, includes a through silicon via (TSV) and an electromigration (EM) monitor. The TSV includes at least one perimeter sidewall. The EM monitor includes a first EM wire separated from the perimeter sidewall of the TSV by a dielectric.

12 Claims, 8 Drawing Sheets

(56) References Cited

U.S. PATENT DOCUMENTS

2013/0038334 A1    2/2013  Brochu, Jr. et al.

OTHER PUBLICATIONS

R. L. de Orio et al., "Electromigration failure in a copper dual-damascense structure with a through silicon via," Microelectronics Reliability, vol. 52, No. 9, 2012, pp. 1981-1986.
J. Pak et al., "Electromigration study for multi-scale power/ground vias in TSV-based 3D ICs," IEEE/ACM International Conference on Computer-Aided Design (ICCAD), 2013, pp. 379-386.
Joseph et al., "Through-silicon vias enable next-generation SiGe power amplifiers for wireless communications," IBM J. Res. & Dev. vol. 52 No. 6 Nov. 2008.
List of IBM Patents or Patent Applications Treated as Related, dated herewith.

* cited by examiner

ELECTROMIGRATION MONITOR

FIELD

Embodiments of invention generally relate to semiconductor devices, design structures for designing a semiconductor device, and semiconductor device fabrication methods. More particularly, embodiments relate to semiconductor structures with an electromigration monitor.

BACKGROUND

Electromigration (EM) is the transport of material caused by movement of ions in an electrical conductor due to momentum transfer between conducting electrons and diffusing metal atoms. The effects of EM are important in applications where high current densities are used, such as in the microelectronics industry. For example, as the size of electronic structures, such as integrated circuits (ICs) decreases, the effects of EM increase.

A particular EM effect is a reliability decrease of semiconductor chips or other ICs. EM may also cause the eventual loss of electrical connections or failure of a circuit. Although EM damage may ultimately result in the failure of the IC, some IC may exhibit seemingly random errors prior to the failure. In a laboratory setting, EM failure may be seen utilizing an electron microscope. With increasing miniaturization of electronic components, the probability of failure due to EM increases due to increasing power density and current density.

In some semiconductor manufacturing processes, copper has replaced aluminum as the interconnect material of choice. Though copper is more fragile, it has become preferred for its superior conductivity and lower susceptibility to EM effects. However, EM continues to be an ever present challenge to the semiconductor device fabrication industry.

Recently, three-dimensional integration of integrated circuits with through-silicon-vias (TSVs) has been used by the semiconductor industry for achieving enhanced electron device capabilities. TSVs create electrical paths through the entire silicon substrate. Such structures and associated processes present a new challenge for EM reliability of surrounding BEOL interconnects.

SUMMARY

In an embodiment of the present invention, a semiconductor structure is claimed. The semiconductor structure includes a through silicon via (TSV) and an electromigration (EM) monitor. The TSV includes at least one perimeter sidewall. The EM monitor includes a first EM wire separated from the perimeter sidewall of the TSV by a dielectric.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of invention generally relate to semiconductor devices, and more particularly to semiconductor structures including a through silicon via (TSV). A TSV is generally a vertical electrical connection via (Vertical Interconnect Access) passing completely through a silicon wafer or die. TSVs may be utilized to create various 3D packages. A particular 3D package (System in Package, Chip Stack MCM, etc.) may include two or more chips stacked vertically so that they occupy less space and/or have greater connectivity. An alternate type of 3D package includes a chip stacked upon a carrier substrate containing TSVs used to connect multiple chips together.

In some 3D packages, stacked chips are wired together along their edges. In other 3D packages, TSVs replace edge wiring by creating vertical connections through the body of the chips. Such TSV may be referred to as TSS (Through-Silicon Stacking or Thru-Silicon Stacking).

Another particular 3D package may be a 3D integrated circuit (3D IC). A 3D IC may be a single IC built by stacking silicon wafers and/or dies and interconnecting them vertically with TSVs to form a single device. By using TSVs, 3D ICs can increase electrical connections and associated wiring into a smaller area, leading to faster device operation, etc. The different devices in the stack may be heterogeneous, e.g. combining CMOS logic, DRAM and III-V materials into a single 3D IC or homogeneous.

Referring now to the figures, wherein like components are labeled with like numerals, exemplary fabrication steps of forming a semiconductor structure 10 in accordance with embodiments of the present invention are shown, and will now be described in greater detail below. The specific number of components depicted in the figures and the cross section orientation was chosen to best illustrate the various embodiments described herein.

Figure 1:
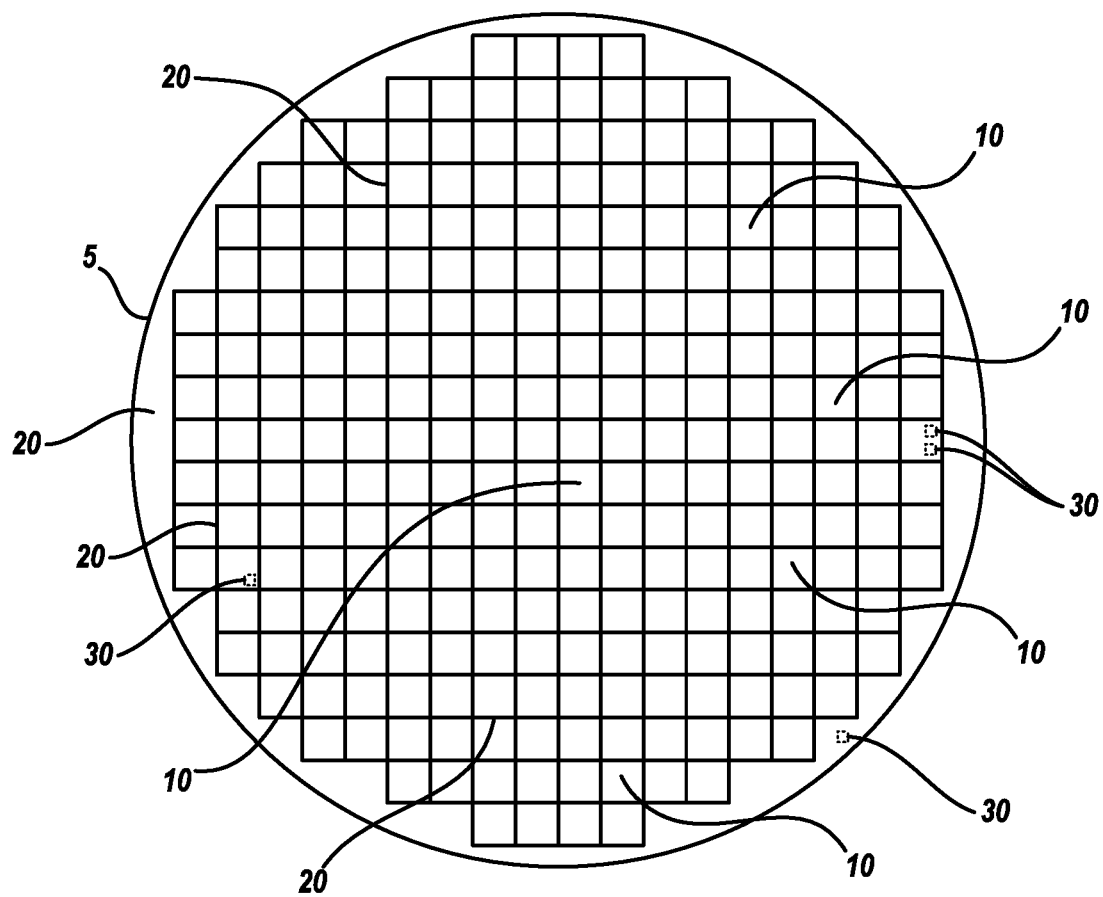
FIG. 1 depicts a semiconductor wafer, in accordance with various embodiments of the present invention.

FIG. 1 depicts a semiconductor wafer 5 with various regions, in accordance with various embodiments of the present invention. Wafer 5 may include a plurality of chips 10 separated by kerfs 20. Each chip 10 may include an active region wherein IC devices, microelectronic devices, etc. may be built using microfabrication process steps such as doping or ion implantation, etching, deposition of various materials, photolithographic patterning, electroplating, etc. Wafer 5 may further comprise one or more testing regions 30. In various embodiments, the one or more testing regions 30 may be included within the active region of a chip 10 and/or may be included within various kerf 20 locations.

Figure 2:
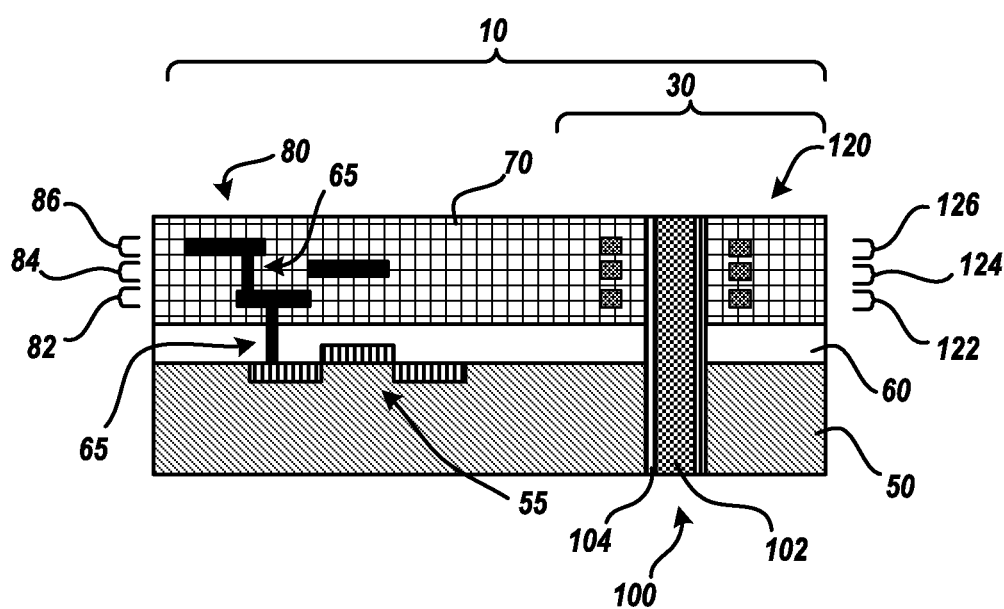
FIG. 2-FIG. 3 depict cross section views of semiconductor structures, in accordance with various embodiments of the present invention.
Figure 3:
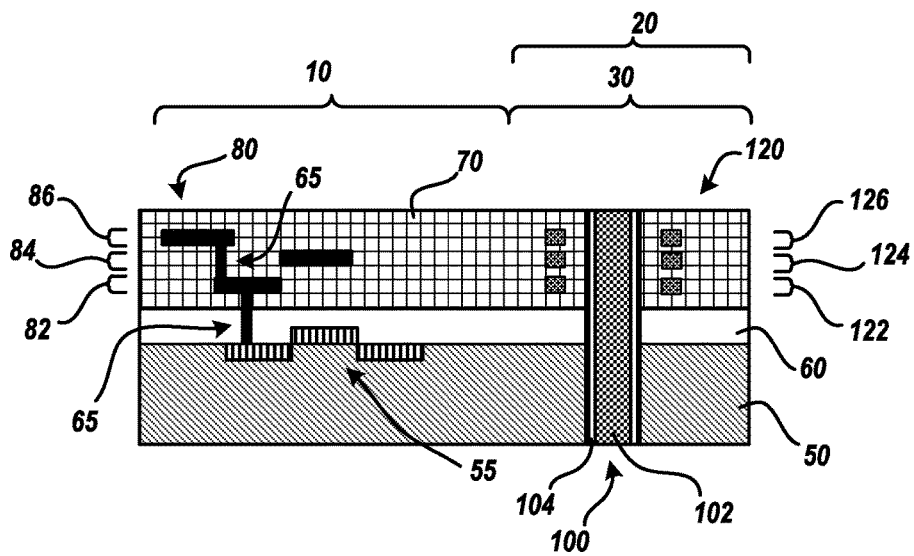

Referring to FIG. 2 and FIG. 3 that depict cross section views of a semiconductor structure at intermediate stages of semiconductor device fabrication, in accordance with various embodiments of the present invention. For example, at the present stage of wafer 5 fabrication, chips 10 may include a semiconductor substrate 50, a front end of the line (FEOL) layer 60 upon the substrate 50, and a back end of the line (BEOL) layer 70 upon the FEOL layer 60.

The semiconductor substrate 50 may include, but is not limited to: any semiconducting material such conventional Si-containing materials, Germanium-containing materials, GaAs, InAs and other like semiconductors. Si-containing materials include, but are not limited to: Si, bulk Si, single crystal Si, polycrystalline Si, SiGe, amorphous Si, silicon-on-insulator substrates (SOI), SiGe-on-insulator (SGOI), annealed poly Si, and poly Si line structures. In various embodiments, substrate 50 may be, for example, a layered substrate (e.g. silicon on insulator) or a bulk substrate.

In various embodiments, devices 55 may be formed upon or within the substrate 50. Devices 55 and the process of device 55 fabrication are well known in the art. Devices 55 may be for example, a diode, field effect transistor (FET), metal oxide FET (MOSFET), logic gate, or any suitable combination thereof. Devices 55 also may be components such as a gate, fin, source, drain, channel, etc. that when combined form a device 55. For clarity, though one device 55 is shown, there are typically numerous devices 55 included within active regions of each chip 10. In certain embodiments, devices 55 may be formed within substrate 50. For example, a source and drain may be formed within substrate 50. To electrically isolate various devices 55 from another device 55, chips 10 may include isolation regions (not shown) formed upon and/or within substrate 50 (e.g. an isolation region may electrically isolate an n-FET device 55 from a p-FET device 55, etc.).

The FEOL layer 60 is the layer of chip 10 that generally includes individual devices 55 (e.g. transistors, capacitors, resistors, etc.) patterned in or upon substrate 50. For example, FinFETs may be implemented in FEOL layer 60 with gate first or gate last FinFET fabrication process techniques. The FEOL layer 60 may include devices 55, one or more dielectric layers, vias 65 to electrically connect device 55 to BEOL wiring layers, etc. The BEOL layer 70 is the layer of chip 10 including wiring 80 formed by known wiring fabrication techniques. The BEOL wiring 80 may be formed as various wiring lines at differing levels. For example, wiring layer 82 may be formed, followed by wiring layer 84 that is generally above wiring layer 82, followed by wiring layer 86 that is generally above wiring layer 84. BEOL layer 70 may further include vias 65 to electrically connect various wiring 80 layers and/or to connect a wiring 80 layer with a device 55.

According to various embodiments of the present invention, BEOL layer 70 may also include an electromigration (EM) monitor 120. EM monitor 120 is generally located within testing region 30 and arranged about the perimeter of or a portion of the perimeter of a TSV 100. EM monitor 120 includes one or more EM lines at one or more EM layers 122, 124, 126. In various embodiments, a particular EM layer may be formed simultaneously with a particular wiring layer. For instance, EM layer 122 may be formed in association with wiring layer 82, EM layer 124 may be formed in association with wiring layer 84, and EM layer 126 may be formed in association with wiring layer 86. In certain embodiments, top and bottom surfaces of one or more EM layers may be coplanar with respective top and bottom surfaces of the associated wiring layer.

BEOL layer 70 may also include multiple dielectric layers that may be utilized to form wiring 80. For example, BEOL layer 70 may include a first dielectric layer generally utilized for form wiring layer 82 and/or EM layer 122, a second dielectric layer generally utilized to form wiring layer 84 and/or EM layer 124, a third dielectric layer generally utilized to form wiring layer 86 and/or EM layer 126, etc.

In various embodiments, wiring lines and EM lines may be formed, for example, utilizing photolithography, etching, and deposition techniques. More specifically, a pattern may be produced by applying a masking layer such as a photoresist or photoresist with an underlying hardmask, to a surface to be etched; exposing the photoresist to a pattern of radiation; and then developing the pattern into the photoresist utilizing a resist developer. Once the patterning of the photoresist is completed, the sections covered by the photoresist are protected while the exposed regions are removed using a selective etching process that removes the unprotected regions. Such etching techniques may form wiring line trenches and/or EM line trenches that may be filled, deposited, etc. with an electrically conductive material to form the wiring line and/or EM line. In certain embodiments, multiple etchings and depositions may be employed to form the various wiring layers 82, 84, 86, etc. and/or EM layers 122, 124, 126, etc.

Testing region 30 may also include TSV 100. TSV 100 is a vertical electrical connection via passing completely through chip 10. TSV 100 may also be formed utilizing photolithography and etching techniques to form a TSV trench. In certain embodiments, TSV 100 may be a pillar, stud, etc. and may be fabricated by forming an electrically insulating film 104 on an internal surface of the TSV trench and filling the remaining internal space of the TSV trench with an electrically conductive material 102. In certain embodiments the electrically insulating film 104 may be omitted and the electrically conductive material 102 may be formed within the TSV trench. For the TSV 100 to pass completely through chip 10, a handler substrate may be attached to a front side of wafer 5 so that the backside of wafer 5 may be planarized and or subjected to a grinding technique until TSV 100 is exposed. In this manner TSV 100 passes completely through chip 10 (e.g. TSV 100 passes through substrate 50, BEOL wiring layer 70, FEOL layer 60) as exemplarily shown in FIG. 2 and FIG. 3.

In subsequent wafer 5 fabrication stages a backside and front side contacts (not shown) may be formed. The contacts may be electrically conductive contact pads electrically coupled to TSV 100 and may be fabricated by forming a pad opening in a deposited dielectric layer, forming a seed layer, performing an electrochemical plating (ECP) to fill the opening with a metallic material, and then performing a CMP to remove excess metallic material. Additional metal layers or bumps (e.g. solder bumps, etc.) may also be formed upon the contacts and electrically coupled to TSV 100 to allow for subsequent interconnect with another electrical package (e.g. IC, chip 10, interposer, etc.).

In various embodiments, TSV 100 is formed generally within EM monitor 120. In certain embodiments, a TSV 100 and an associated EM 120 is formed within testing region 30 comprised within an active area of chip 10 as shown in FIG. 2. In other embodiments, a TSV 100 and an associated EM 120 is formed within testing region 30 comprised within a kerf 20 as shown in FIG. 3.

Figure 4A:
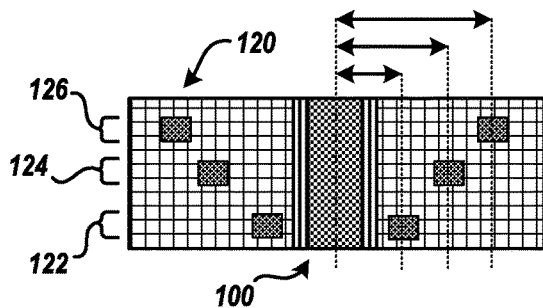
FIG. 4A-FIG. 4D depict detailed cross section views of semiconductor structures, in accordance with various embodiments of the present invention.
Figure 4B:
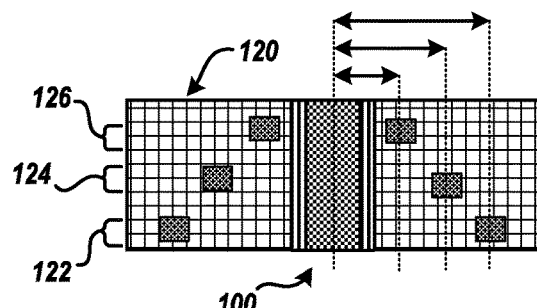
Figure 4C:
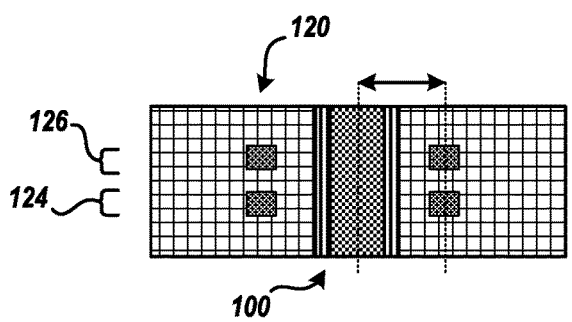
Figure 4D:
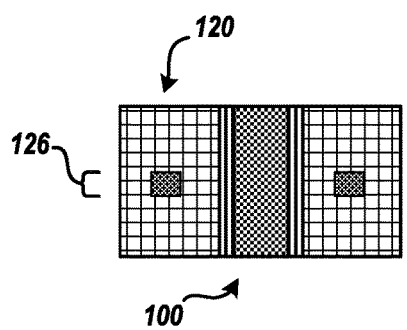

FIG. 4A-FIG. 4D depict detailed cross section views of semiconductor structures including EM monitor 120 and TSV 100, in accordance with various embodiments of the present invention. The view of FIG. 4A-FIG. 4D are shown parallel to the length and through the center of TSV 100. Particularly, FIG. 4A depicts wiring or wiring group in EM layer 122 generally positioned nearest to TSV 100, wiring or wiring group in EM layer 126 generally positioned furthest away from TSV 100, and wiring or wiring group in EM layer 124 generally positioned at an intermediate dimension from TSV 100. FIG. 4B depicts wiring or wiring group in EM layer 122 generally positioned furthers from TSV 100, wiring or wiring group in EM layer 126 generally positioned nearest to TSV 100, and wiring or wiring group in EM layer 124 generally positioned at an intermediate dimension from TSV 100. FIG. 4C depicts a semiconductor structure including two EM layers 124, 126, having wiring or wiring groups generally positioned at a similar dimension from TSV 100. FIG. 4D depicts a semiconductor structure including wiring or wiring group within a single EM layer 126. Though one, two, or three EM layers are shown in the drawings, it is realized that a semiconductor structure may include additional EM layers.

Figure 5A:
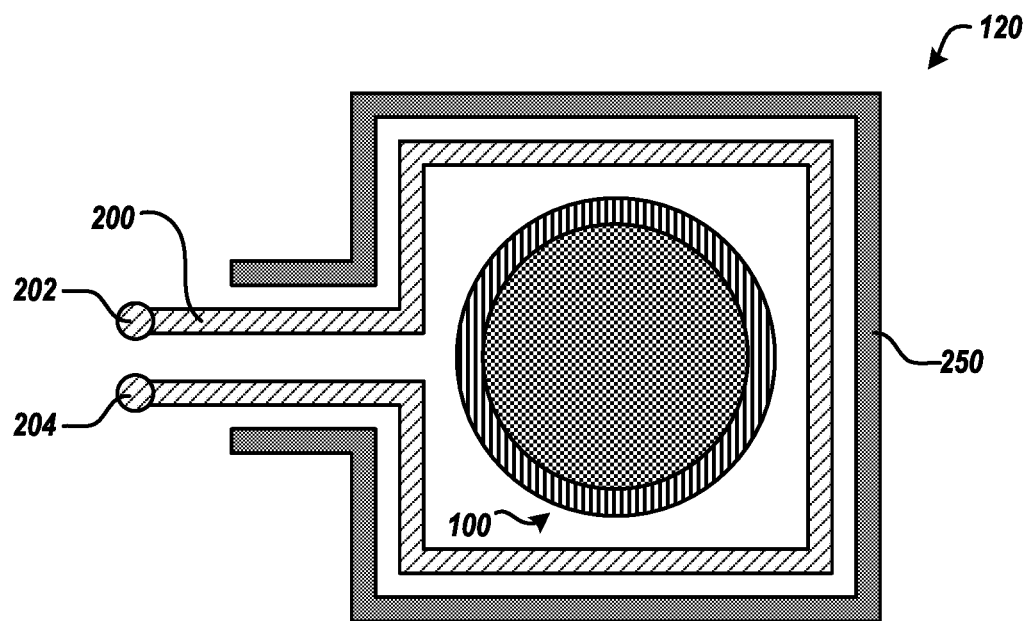
FIG. 5A-FIG. 5B depict detailed cross sectional views of semiconductor structures, in accordance with various embodiments of the present invention.
Figure 5B:
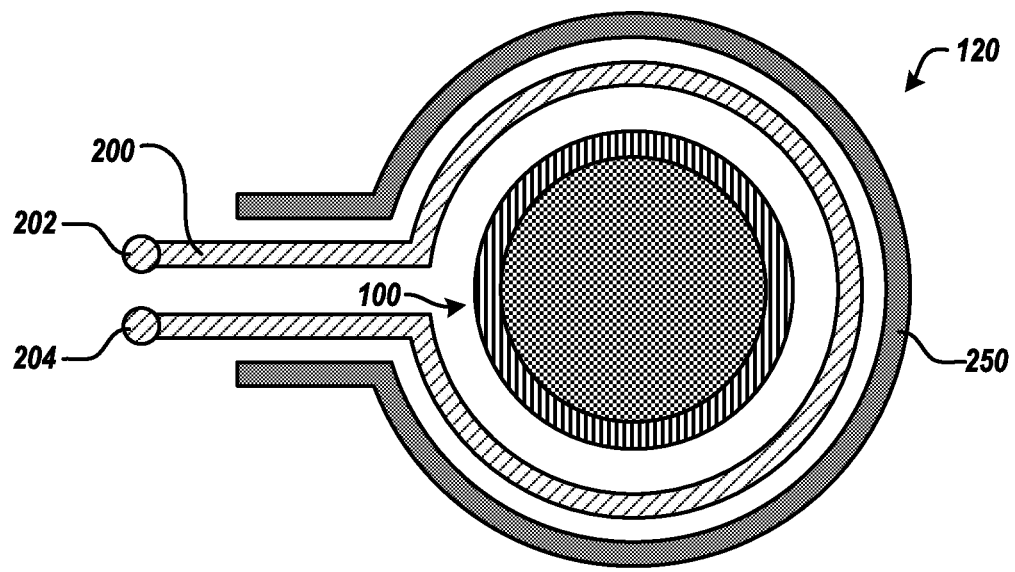

FIG. 5A-FIG. 5B depict detailed top-down cross sectional views of semiconductor structures including EM monitor 120 and TSV 100, in accordance with various embodiments of the present invention. The view of FIG. 5A-FIG. 5B is shown parallel to and through an EM layer. In certain embodiments, EM monitor 120 is the structure or method of measuring leakage current from an EM wire 200 that is positioned in physically close proximity to the perimeter or the portion of the perimeter of TSV 100. In certain embodiments, the EM wire 200 may be positioned about the perimeter or the portion of the perimeter of multiple TSVs 100. There may be numerous EM wires 200 within EM monitor 120. For example, there may be an EM wire 200 in each EM layer 122, 124, 126, etc. An electrical current may be forced upon EM wire 200 such that an electron flow is in the direction from cathode end 202 toward the anode end 204 of EM wire 200. A resistance increase and drop across EM wire 200 may be measured and compared to a theoretical, known, anticipated, etc. resistance increase and drop to determine potential voids and current leakage, etc. Resistance increase or current leakage increase may occur due to EM effects in relation to the proximate TSV 100. In various embodiments, the cathode end 202 may be electrically connected to wiring layer 82, 84, 86, etc. to force the current and the anode end 204 may be electrically connected to wiring layer 82, 84, 86, etc. to sense the current. In other embodiments, the cathode end 202 may be electrically connected to via 65, etc. which provides for an electrical connection to an external device to force the current and the anode end 204 may be electrically connected to via 65, etc. which provides for an electrical connection to the external device to sense the current.

In some embodiments, as shown in FIG. 5A and FIG. 5B, EM monitor 120 also includes extrusion monitor wire 250 in close physical proximity to EM wire 200. For example, extrusion monitor wire 250 may be less than 1 µm from EM wire 200. There may be numerous extrusion monitor wires 250 within EM monitor 120. For example, there may be an extrusion monitor wire 250 in each EM layer 122, 124, 126, etc. In certain embodiments, the extrusion monitor wire 250 serves as a dummy line to aid in the fabrication, printing, formation, etc. of EM wire 200 and may be positioned further from EM wire 200. In other embodiments, the extrusion monitor wire serves as an extrusion monitor. As extrusion occurs in the EM wire 200 during EM stress associated with high current densities, an electrical short or increase in leakage current is expected to occur between the EM wire 200 and the parallel-running extrusion monitor wire 250. When extrusion monitor wire 250 is included within EM monitor 120 the combination of EM wire 200 and extrusion monitor wire 250 may form a wiring group within the EM layer. Because the EM wire 200 and extrusion monitor wire 250 may be included within EM layers 122, 124, 126, etc., the dimension from the outer surface of TSV 100 and the nearest surface of e.g. EM wire 200 may vary depending upon the respective EM layer 122, 124, 126, etc. considered.

In certain embodiments, exemplarily shown in FIG. 5A, the EM wire 200 is nearest a predetermined TSV 100 keep out area orthogonally arranged about the TSV 100. Such and arrangement allows for sensitive four point EM effect monitor nearest TSV 100. In certain embodiments, exemplarily shown in FIG. 5B, the EM wire 200 is circularly arranged proximate to TSV 100. In certain embodiments, via 65 connected to EM wire 200 at the e.g. cathode end 202 and the anode end 204 are remote to TSV 100 relative to EM wire 200 to allow for the separation of interface effects from via effects and/or delamanation and extrusion. Interface effects relate to e.g. submicron Cu lines with near bamboo grain structures, diffusion at Cu and top capping layer interface dominates EM mass transport and voids may form at the top of Cu line. Via effects relate to e.g. vias 65 that are connected to EM wire 200 being a weak spot for voids to nucleate and agglomerate. By placing vias remotely away from TSV 100, such via effect could be minimized and interface effect induced void formation in EM wire 200 during EM stress could be purposely detected if TSV proximity effect on EM wire 200 is present.

Figure 6A:
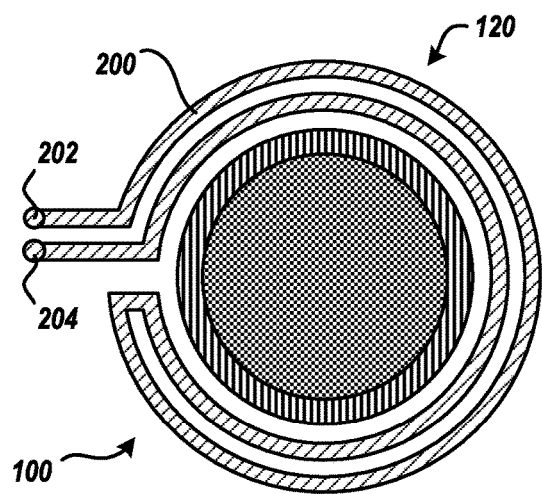
FIG. 6A-FIG. 6C depict detailed cross sectional views of semiconductor structures, in accordance with various embodiments of the present invention.
Figure 6B:
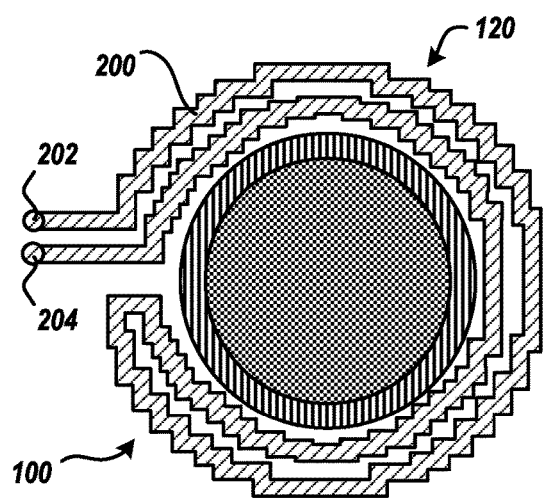
Figure 6C:
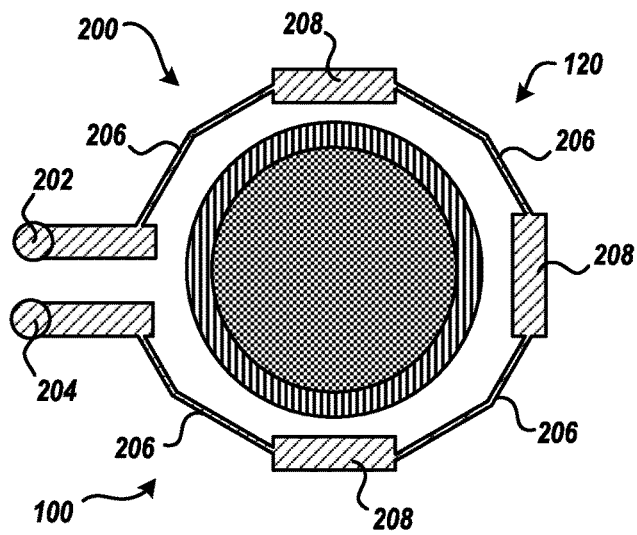

FIG. 6A-FIG. 6C depict detailed top-down cross sectional views of semiconductor structures including EM monitor 120 and TSV 100, in accordance with various embodiments of the present invention. The view of FIG. 6A-FIG. 6C is shown parallel to and through an EM layer.

As shown in FIG. 6A, EM wire 200 may be arranged in a loop that positioned in physically close proximity to the perimeter or the portion of the perimeter of TSV 100. Though a single loop is shown in FIG. 6A, the EM wire 200 may be arranged in numerous loops positioned about the perimeter or the portion of the perimeter of TSV 100. In certain embodiments, the EM wire 200 may be looped about the perimeter or the portion of the perimeter of multiple TSVs 100. Depending upon wire printing, formation, fabrication, etc. limitations, circular shaped wiring may be achieved by arranging numerous vertical and horizontal wiring portions to form EM wire 200 positioned about the perimeter or the portion of the perimeter of TSV 100, as shown in FIG. 6B.

As shown in FIG. 6C, EM wire 200 may include portions 206 of high current density electrically connected to portions 208 of low current density. Generally, portions 206 have a smaller cross sectional area relative to portions 208 leading the current density differences. Because the portions 206 are subjected to a higher current density the portions 206 are more susceptible to EM effects. Such increased sensitivity to induced extrusion would occur near portion 206 of EM wire 200 to which electrons and thus metal atoms flow, causing increased stress, delamination/cracking in dielectric layers, current leakage, and potential electrical shorting to an adjacent current carrying structure such as TSV 100, extrusion monitor wire 250, etc. In certain embodiments portions 206 and portions 208 may be included in a similar EM layer. In other embodiments, portions 206 and portions 208 may be included in differing EM layers. For example, portion 206 may be located in EM layer 122 and portions 208 may be located in EM layer 124. In various embodiments, portion 206 or portion 208 may be electrically connected to the cathode end 202 or the anode end 204. Portions 206 may be shorter in length relative to portions 208 to evaluate whether the "short-length" effect is the same in the immediate vicinity of TSV 100 as it is far away. If the short-length behavior is different, the short-length rule may be changed near TSV 100, the short wiring lines 80 should be kept away from TSV 100 in active areas of chips 10 by a specified distance, etc. Also, since the short-length effect is a direct result of mechanical confinement in metal lines from surrounding dielectrics, EM monitor 120 can be used as a test structure to detect if the mechanical integrity of dielectric layers is compromised by TSV 100 fabrication process and/or induced EM stress.

Figure 7:
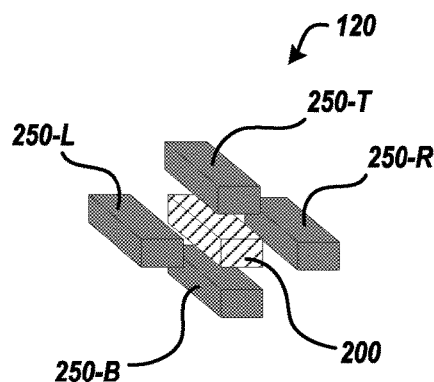
FIG. 7 depicts an isometric view of sections of an EM monitor, in accordance with various embodiments of the present invention.

FIG. 7 depicts an isometric view of sections of EM monitor 120, in accordance with various embodiments of the present invention. In certain implementations, EM wire 200 may be in close physical proximity to a surrounding one or more extrusion monitor wires 250. For example, a bottom extrusion monitor wire 250-B may be less than 1 µm from EM wire 200, a top extrusion monitor wire 250-T may be less than 1 µm from EM wire 200, a right extrusion monitor wire 250-R may be less than 1 µm from EM wire 200, and/or a left extrusion monitor wire 250-L may be less than 1 µm from EM wire 200. For clarity, the EM wire 200 may be surrounded by less than or greater than four extrusion monitor wires 250. For example, EM wire 200 may be surrounded by extrusion monitor wires 250-T, 250B, and 250-R forming a wiring group. The wiring group may be in close proximity to TSV 100 such that e.g. extrusion monitor wires 250-T, 250-B, and EM wire 200 are in close proximity to TSV 100. In certain embodiments, EM wire 200 and extrusion monitor wires 250-L, 250-R may be included in a similar EM layer. For example, extrusion monitor 250-B may be included within EM layer 122, EM wire 200 and extrusion monitor wires 250-L, 250-R may be included within EM layer 124, and extrusion monitor 250-T may be included within EM layer 126.

FIG. 8A-FIG. 8E depict detailed top-down cross sectional views of semiconductor structures including EM monitor 120 and TSV 100, in accordance with various embodiments of the present invention. The view of FIG. 8A-FIG. 8E is shown parallel to and through an EM layer. In certain embodiments, EM monitor 120 is the structure or method of measuring leakage current from EM wire 300 that includes via 65; the EM wire 300 positioned in physically close proximity to the perimeter or the portion of the perimeter of TSV 100. In certain embodiments, EM wire 300 includes one or more portions 306 electrically connected to one or more portions 308 by via 65 generally positioned about the perimeter or the portion of the perimeter of one or more TSVs 100. There may be numerous EM wires 300 within EM monitor 120. For example, there may be an EM wire 300 in each EM layer 122, 124, 126, etc. An electrical current may be forced upon EM wire 300 such that an electron flow is in the direction from cathode end 302 toward the anode end 304 of EM wire 300. A resistance increase or drop across EM wire 300 may be measured and compared to a theoretical, known, anticipated, etc. resistance increase and drop to determine potential voids, current leakage, etc. In various embodiments, the cathode end 302 may be electrically connected to wiring layer 82, 84, 86, etc. to force the current and the anode end 304 may be electrically connected to wiring layer 82, 84, 86, etc. to sense the current. In other embodiments, the cathode end 302 may be electrically connected to via 65, etc. which provides for an electrical connection to an external device to force the current and the anode end 304 may be electrically connected to via 65, etc. which provides for an electrical connection to the external device to sense the current.

In certain embodiments, portions 306 are included in a similar EM layer and portions 308 are included in a similar EM layer. For example, portions 306 may be included in EM layer 122 and portions 308 may be included in EM layer 124. Similarly, the cathode end 302 and/or anode end 304 may be located in similar or differing EM layers. Portions 306 and portions 308 may share a similar dissimilar cross sectional area and associated similar or dissimilar current density. For example, the cross section area of portions nearest TSV 100 may be relatively smaller.

The physical basis of EM of metal atoms in EM wire 200 or EM wire 300 is related to the momentum exchange between conducting electrons and diffusing metal atoms. At any temperature above 0 K, atomic vibrations occur. These vibrations ("phonons") put a metal atom out of its perfect position about 1013 times each second and disturb the periodic potential, causing electron scattering. The scattering event makes the electron change direction, i.e., undergo acceleration for which there is a corresponding force. After many collisions, the force averages out in the direction of electron flow from cathode end toward the anode end of EM wire. The force due to collisions of electrons to metal atoms is called the momentum exchange, which is the same as force. In general, this EM force is proportional to the current density. EM induced extrusion may occur near a portion of EM wire (e.g. at the anode end) to which electrons and thus metal atoms flow, causing delamination/cracking in dielectric layers, current leakage, and potential electrical shorting to an adjacent current carrying structure such as TSV 100, extrusion monitor wire 250, etc. In certain embodiments, each via 65 may be tapped out individually for an applicable EM test.

Figure 8A:
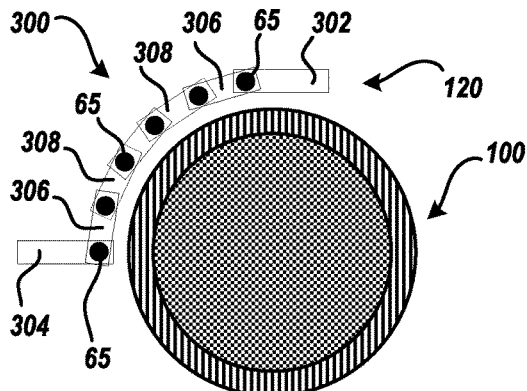
FIG. 8A-FIG. 8E depict detailed cross sectional views of semiconductor structures, in accordance with various embodiments of the present invention.

As shown in FIG. 8A, in certain embodiments, the relative lengths of portions 306 and portions 308 may be similar and electrically connected by via 65 in physical proximity about a perimeter portion of TSV 100.

Figure 8B:
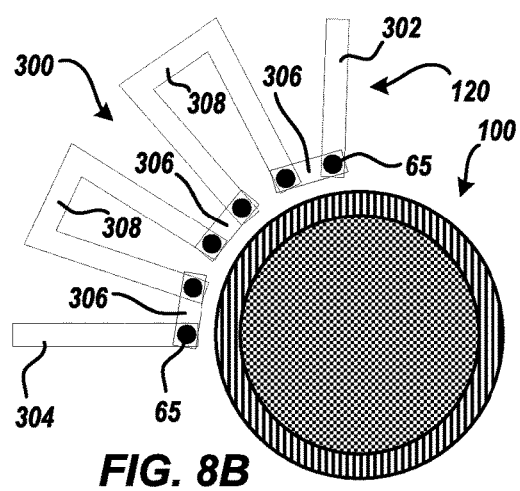
Figure 8C:
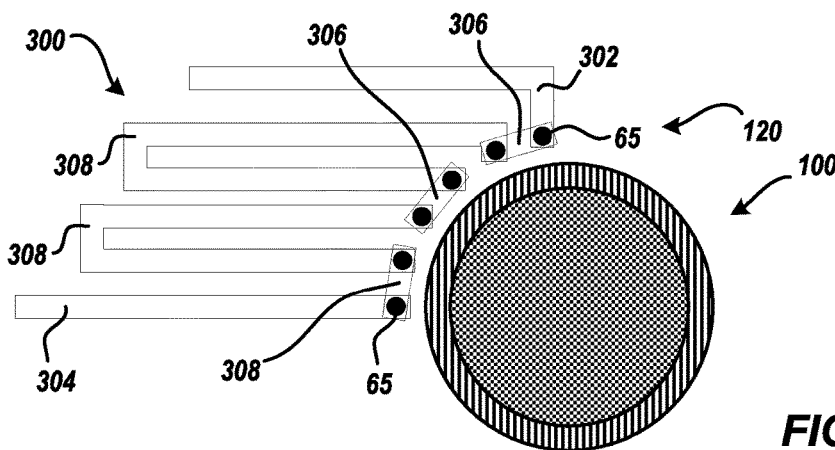

In certain embodiments, EM monitor 120 may be utilized to test for TSV proximity effect. It is therefore may be important to decouple EM effects on wires (e.g. portion 306, 308, etc.) versus vias 65. For example, to determine TSV proximity effect on wires, it may be beneficial to keep vias 65 proximately further away from the TSV 100 relative to EM wiring, or visa versa. Therefore, as exemplarily shown in FIG. 8B and in FIG. 8C, portions 306 may be short links around the perimeter or perimeter portion of TSV 100 that are electrically connected to relatively longer portions 308 by vias 65. In such exemplary embodiment, the TSV 100 proximity effect on the via 65 and via 65 & portion 308 interface may be tested. As shown in FIG. 8B, the longer portions 308 relatively further away from TSV 100 in order to minimize the relative TSV effect, while the critical the via 65 and via 65 & portion 308 interfaces to be evaluated are in close proximity to TSV 100. Also, shorter portions 306 may be used to electrically connect to longer portions 308, so that damage does not occur in the shorter portions 306. In such an exemplary embodiment, single via/line interfaces may be serially evaluated. The dimensions (e.g. total wire length, etc.) of loops formed by portions 308 in FIG. 8B and in FIG. 8C may be changed within each EM layer to further quantify the TSV effect.

Figure 8D:
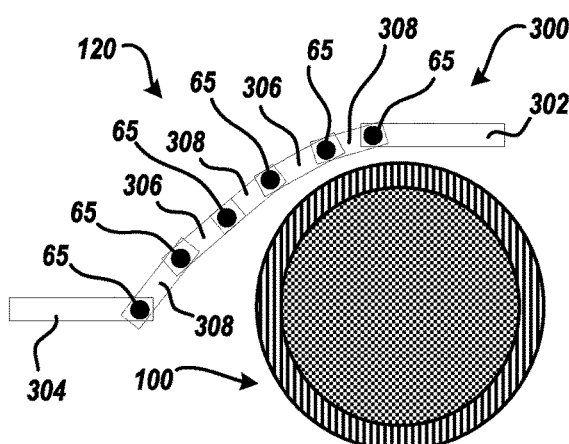
Figure 8E:
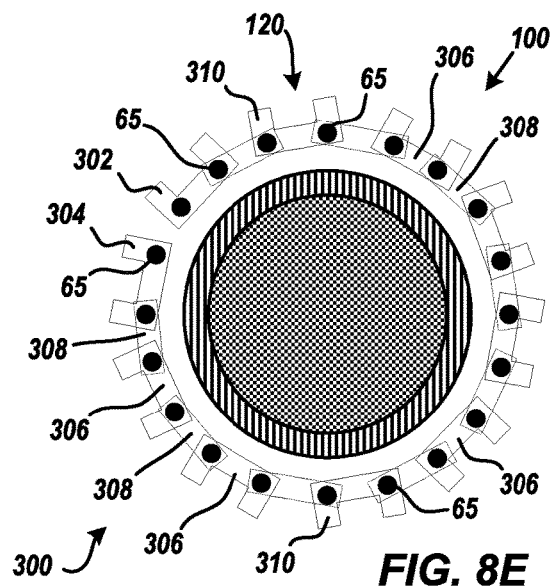

The exemplary EM monitor 120 shown in FIG. 8D may be useful to further quantify the TSV proximity effect by adjusting spacing between vias 65 and TSV 100. The exemplary EM monitor shown in FIG. 8E may consist of serially linked portions 306 and portions 306 in a circular fence configuration to provide enhanced sensitivity for capturing TSV proximity effect from all directions. In certain embodiments, portions 306 and/or portions 308 may include sense tap 410 to allow for current sense, debug, post-stress EM failure localization, etc. Sense tap 410 may be electrically connected to wiring layer 82, 84, 86, etc. to sense the current, etc.

Figure 9A:
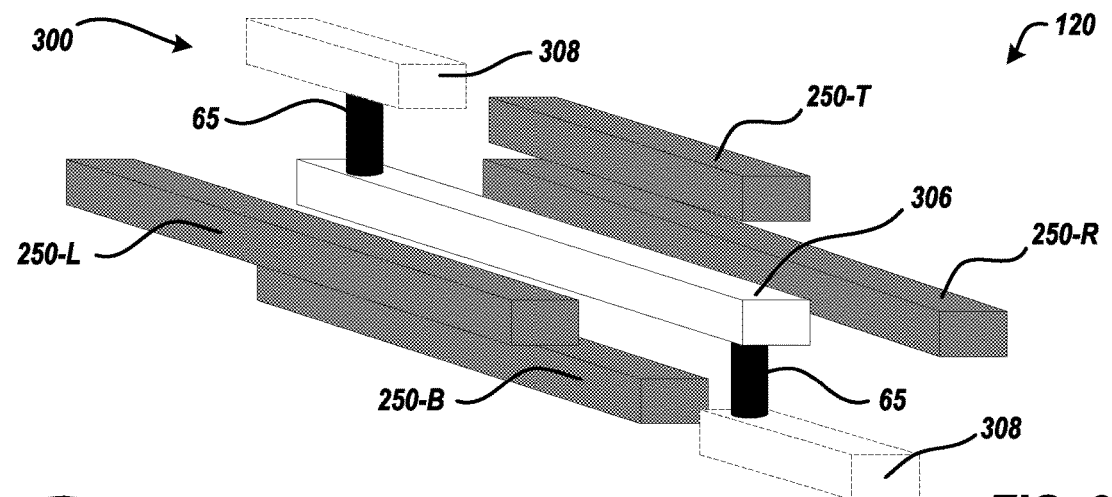
FIG. 9A-FIG. 9C depicts isometric views of portions of an EM monitor, in accordance with various embodiments of the present invention.
Figure 9B:
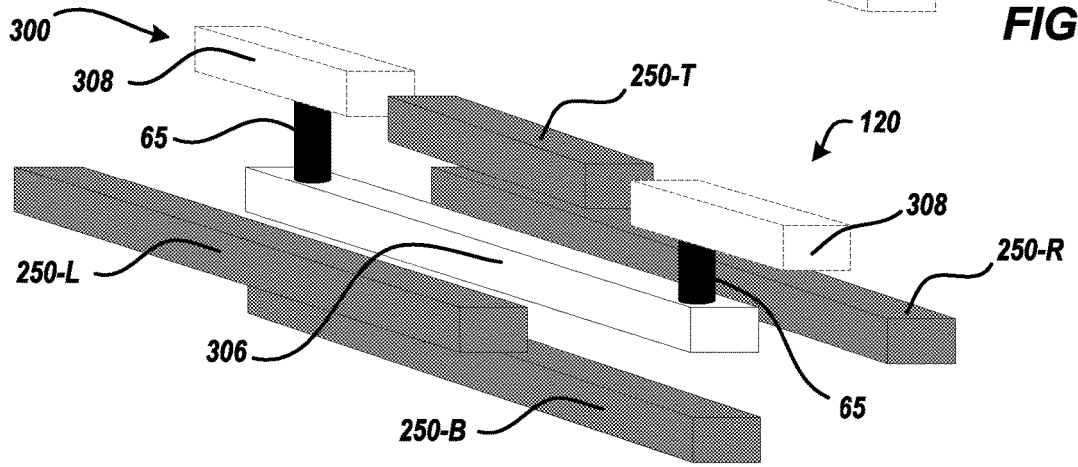
Figure 9C:
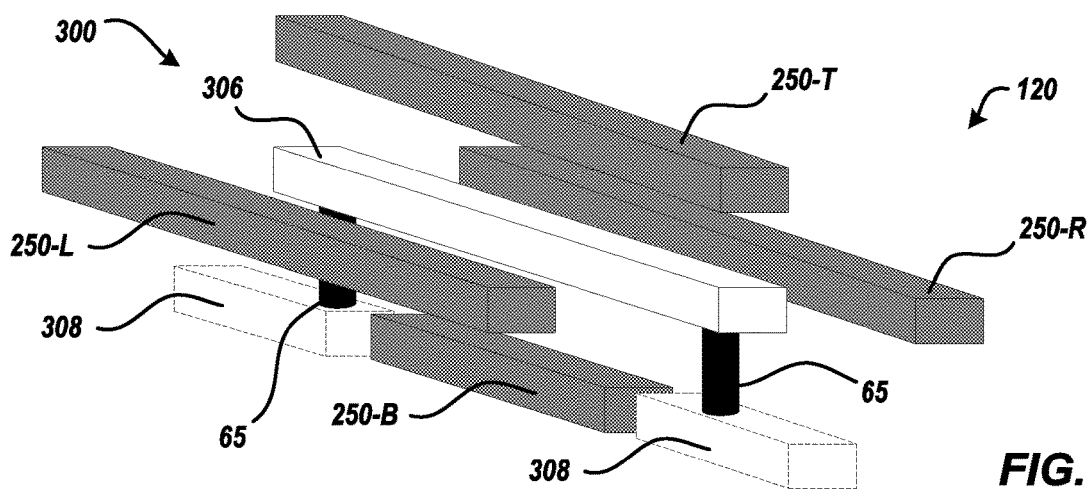

FIG. 9A-FIG. 9C depicts an isometric view of sections of EM monitor 120, in accordance with various embodiments of the present invention. FIG. 9A-FIG. 9C depict exemplary EM monitors that include a EM wire 300 and extrusion monitor wire 250 in close physical proximity to one or more portions of EM wire 300. For example, an extrusion monitor wire 250 may be less than 1 μm from one or more portions of EM wire 300. In certain embodiments, the extrusion monitor wire 250 serves as a dummy line to aid in the fabrication, printing, formation, etc. of EM wire 300 and may be positioned further from EM wire 300. In other embodiments, the extrusion monitor wire 250 serves as an extrusion monitor. As extrusion occurs in the EM wire 300 during EM stress associated with high current densities, an electrical short or increase in leakage current is expected to occur between the EM wire 300 and the parallel-running extrusion monitor wire 250. When extrusion monitor wire 250 is included within EM monitor 120 the combination of EM wire 300 and extrusion monitor wire 250 may form a wiring group within the EM layer. Because the EM wire 300 and/or extrusion monitor wire 250 may be included within EM layers 122, 124, 126, etc., the dimension from the outer surface of TSV 100 and the nearest surface of e.g. EM wire 300 may vary depending upon the respective EM layer 122, 124, 126, etc. considered.

In certain embodiments, the EM wire 300 in surrounded by multiple extrusion monitor wires 250. For instance, a bottom extrusion monitor wire 250-B may be less than 1 μm from EM wire portion 306, a top extrusion monitor wire 250-T may be less than 1 μm from EM wire portion 306, a right extrusion monitor wire 250-R may be less than 1 μm from EM wire portion 306, and/or a left extrusion monitor wire 250-L may be less than 1 μm from EM wire portion 306. For clarity, the EM wire 300 may be surrounded by less than or greater than four extrusion monitor wires 250.

In the exemplary EM monitor shown in FIG. 9A, a top EM wire portion 308 may be included in a similar EM wiring layer 126 as extrusion monitor 250-T, EM wire portion 306 may be included in a similar EM wiring layer 124 as extrusion monitor 250-L and 250-R, and a bottom EM wire portion 308 may be included in a similar EM wiring layer 122 as extrusion monitor 250-B. In such similar embodiments, the extrusion monitor wires 250-T, 250B, and 250-R forming a wiring group. The wiring group may be in close proximity to TSV 100 such that e.g. extrusion monitor wires 250-T, 250-B, and EM wire portions 306, 308 are in close proximity to TSV 100.

In the exemplary EM monitor shown in FIG. 9B, a first top EM wire portion 308 and a second top wire portion 308 may be included in a similar EM wiring layer 126 as extrusion monitor 250-T, EM wire portion 306 may be included in a similar EM wiring layer 124 as extrusion monitor 250-L and 250-R, and a extrusion monitor 250-B may be in wiring layer 122. In an exemplary embodiment, 250-R may be omitted from the wiring group and portions 308, 306 and extrusion monitors 250-T, 250-B may be in close proximity to TSV 100.

In the exemplary EM monitor shown in FIG. 9C, a first bottom EM wire portion 308 and a second bottom wire portion 308 may be included in a similar EM wiring layer 122 as extrusion monitor 250-B, EM wire portion 306 may be included in a similar EM wiring layer 124 as extrusion monitor 250-L and 250-R, and a extrusion monitor 250-T may be in wiring layer 126. In an exemplary embodiment, 250-L may be omitted from the wiring group and portions 308, 306 and extrusion monitors 250-T, 250-B may be in close proximity to TSV 100.

Figure 10:
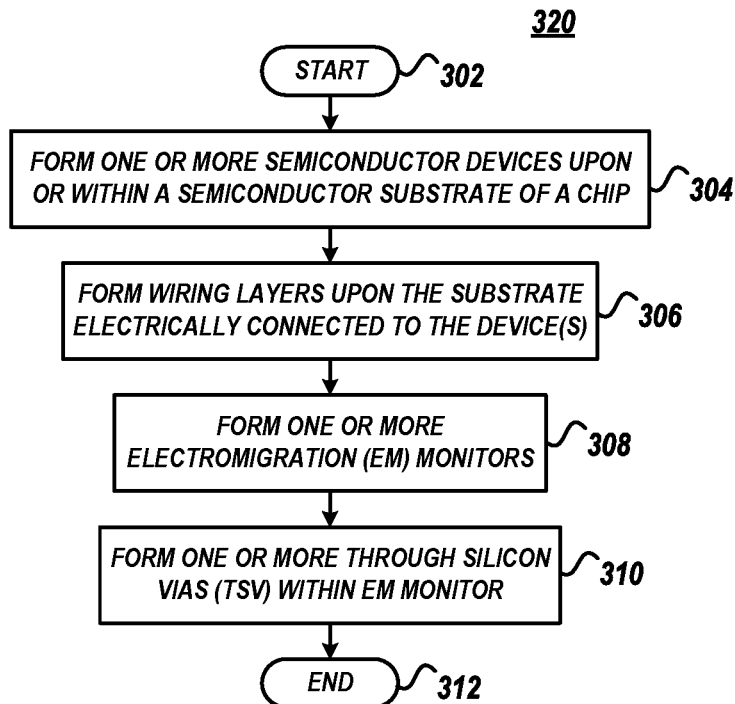
FIG. 10 depicts an exemplary semiconductor device fabrication process flow method, in accordance with various embodiments of the present invention.

FIG. 10 depicts an exemplary semiconductor device fabrication process flow method 320, in accordance with various embodiments of the present invention. Method 320 begins at block 302 and continues by forming one or more semiconductor devices (e.g. devices 55, etc.) upon or within a semiconductor substrate (e.g. substrate 50, etc.) (block 304). For example, a transistor may be formed upon substrate 50 and/or a FinFET fin may be formed upon substrate 50, etc.

Method 320 may continue with forming a plurality of wiring layers (e.g. wiring 80, etc.) upon the semiconductor substrate 50 (block 306). For example, wiring layers 82, 84, 86, etc. may be formed upon the substrate 50 in BEOL fabrication processes. Some or the plurality of wiring layers may be electrically connected to the devices.

Method 320 may continue with forming one or more EM monitors (e.g. EM monitor 120, etc.) (block 308). In certain embodiment, the EM monitors may include a plurality of EM wiring layers that may be formed in association with respective wiring 80 layers. For example, EM layer 122 may be formed in association with wiring layer 82, EM layer 124 may be formed in association with wiring layer 84, and EM layer 126 may be formed in association with wiring layer 86, etc.

Method 320 may continue with forming a TSV (e.g. TSV 100, etc.) within the perimeter of EM monitor (block 310). For example, a TSV trench may be etched and filled with TSV material, the backside of the substrate may be removed to expose the TSV through the backside of the substrate, etc. In certain embodiments, method 320 may continue with further semiconductor fabrication techniques that may add or remove components, materials, etc. in further front end of line, middle end of line, or back end of line, etc. fabrication steps to form a semiconductor device. Method 320 ends at block 312.

Figure 11:
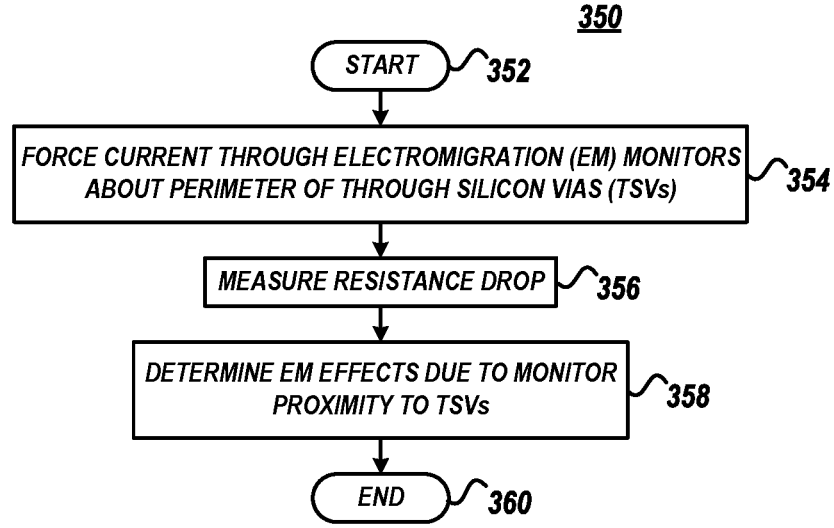
FIG. 11 depicts an exemplary EM testing method, in accordance with various embodiments of the present invention.

FIG. 11 depicts an exemplary EM testing method 350, in accordance with various embodiments of the present invention. Method 350 begins at block 352 and continues with forcing electrical current through EM monitor wiring (e.g. EM wiring 200, EM wiring 300, etc.) arranged in close proximity to the perimeter or a portion of the perimeter of a TSV (e.g. TSV 100, etc.) (block 354). Method 350 may continue with measuring an electrical resistance increase or drop across the EM monitor wiring (block 356). Method 350 may continue with determining EM effects (e.g. stress, delaminating, failure, shorting, whether an early electrical open or resistance increase exists within the EM monitor wiring due to TSV 100 induced proximity effect, etc.) due to the EM monitor wiring proximity to the TSV (block 358). For example, it may be determined whether an electrical short exists between the EM monitor wiring and the TSV from the measured electrical resistance. Method 350 ends at block 460.

Figure 12:
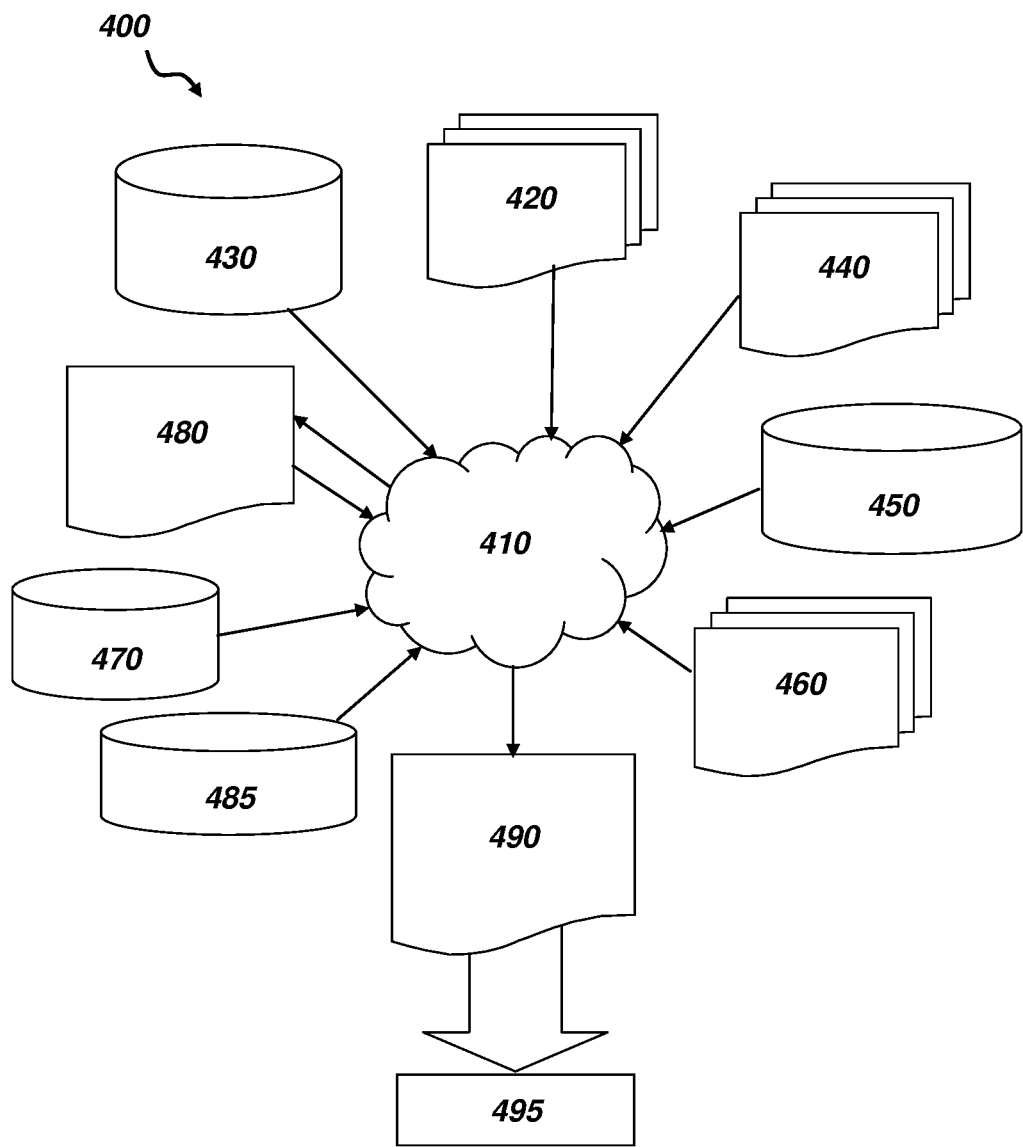
FIG. 12 depicts a flow diagram of a design process used in semiconductor design, manufacture, and/or test, in accordance with various embodiments of the present invention.

Referring now to FIG. 12, a block diagram of an exemplary design flow 400 used for example, in semiconductor integrated circuit (IC) logic design, simulation, test, layout, and/or manufacture is shown. Design flow 400 includes processes, machines and/or mechanisms for processing design structures or devices to generate logically or otherwise functionally equivalent representations of the structures and/or devices described above and shown in FIGS. 1-9C.

The design structures processed and/or generated by design flow 400 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 400 may vary depending on the type of representation being designed. For example, a design flow 400 for building an application specific IC (ASIC) may differ from a design flow 400 for designing a standard component or from a design flow 400 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 420 that is preferably processed by a design process 410. Design structure 420 may be a logical simulation design structure generated and processed by design process 410 to produce a logically equivalent functional representation of a hardware device. Design structure 420 may also or alternatively comprise data and/or program instructions that when processed by design process 410, generate a functional representation of the physical structure of a hardware device. Whether representing functional and/or structural design features, design structure 420 may be generated using electronic computer-aided design (ECAD) such as implemented by a core developer/designer.

When encoded on a machine-readable data transmission, gate array, or storage medium, design structure 420 may be accessed and processed by one or more hardware and/or software modules within design process 410 to simulate or otherwise functionally represent an electronic component, circuit, electronic or logic module, apparatus, device, structure, or system such as those shown in FIGS. 1-9C. As such, design structure 420 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 410 preferably employs and incorporates hardware and/or software modules for synthesizing, translating, or otherwise processing a design/simulation functional equivalent of the components, circuits, devices, or structures shown FIGS. 1-9C to generate a Netlist 480 which may contain design structures such as design structure 420. Netlist 480 may comprise, for example, compiled or otherwise processed data structures representing a list of wires, discrete components, logic gates, control circuits, I/O devices, models, etc. that describes the connections to other elements and circuits in an integrated circuit design. Netlist 480 may be synthesized using an iterative process in which netlist 480 is resynthesized one or more times depending on design specifications and parameters for the device. As with other design structure types described herein, netlist 480 may be recorded on a machine-readable data storage medium or programmed into a programmable gate array. The storage medium may be a non-volatile storage medium such as a magnetic or optical disk drive, a programmable gate array, a compact flash, or other flash memory. Additionally, or in the alternative, the storage medium may be a system or cache memory, buffer space, or electrically or optically conductive devices in which data packets may be intermediately stored.

Design process 410 may include hardware and software modules for processing a variety of input data structure types including Netlist 480. Such data structure types may reside, for example, within library elements 430 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 440, characterization data 450, verification data 460, design rules 470, and test data files 485 which may include input test patterns, output test results, and other testing information. Design process 410 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 410 without deviating from the scope and spirit of the invention claimed herein. Design process 410 may also include modules for performing standard circuit design processes such as timing analysis, verification, design rule checking, place and route operations, etc.

Design process 410 employs and incorporates logic and physical design tools such as HDL compilers and simulation model build tools to process design structure 420 together with some or all of the depicted supporting data structures along with any additional mechanical design or data (if applicable), to generate a second design structure 490. Design structure 490 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures).

Similar to design structure 420, design structure 490 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-9C. In one embodiment, design structure 490 may comprise a compiled, executable HDL simulation model that functionally simulates the devices shown in FIGS. 1-9C.

Design structure 490 may also employ a data format used for the exchange of layout data of integrated circuits and/or symbolic data format (e.g. information stored in a GDSII (GDS2), GL1, OASIS, map files, or any other suitable format for storing such design data structures). Design structure 490 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-9C. Design structure 490 may then proceed to a stage 495 where, for example, design structure 490: proceeds to tape-out, is released to manufacturing, is released to a mask house, is sent to another design house, is sent back to the customer, etc.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

The exemplary methods and techniques described herein may be used in the fabrication of integrated circuit chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples.

Unless described otherwise or in addition to that described herein, "depositing" may include any now known or later developed techniques appropriate for the material to be deposited, including, but not limited to: CVD, LPCVD, PECVD, semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation. Any references to "poly" or "poly silicon" should be understood to refer to polycrystalline silicon.

References herein to terms such as "vertical", "horizontal", etc. are made by way of example, and not by way of limitation, to establish a frame of reference. The term "horizontal" as used herein is defined as a plane parallel to the conventional plane or surface of the substrate, regardless of the actual spatial orientation of the semiconductor substrate. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The invention claimed is:

1. A semiconductor structure comprising:
a substrate;
a front end of line (FEOL) level upon the substrate;
a back end of line (BEOL) level upon the FEOL level, the BEOL level comprising wiring within a wiring level; and
a testing region comprising:
   a through vertical interconnect access (VIA) comprising at least one perimeter sidewall, wherein the through VIA extends entirely through the BEOL level, the FEOL level, and the substrate; and
   an electromigration (EM) monitor comprising a first EM wire within the wiring level, the first EM wire comprising:
      an inside sidewall that faces the perimeter sidewall of the through VIA and is separated from the perimeter sidewall of the through VIA by a dielectric within the BEOL level; and
      a top surface coplanar with an upper surface of the wiring.

2. The semiconductor structure of claim 1, wherein the first EM wire further comprises a bottom surface and an outside surface that faces away from the perimeter sidewall of the through VIA.

3. The semiconductor structure of claim 2, wherein the EM monitor further comprises:
a first extrusion monitor wire that is separated from the first EM top surface by the dielectric.

4. The semiconductor structure of claim 3, wherein the EM monitor further comprises: a second extrusion monitor wire that is separated from the first EM bottom surface by the dielectric.

5. The semiconductor structure of claim 4, wherein the EM monitor further comprises a third extrusion monitor wire that is separated from the first EM outside surface by the dielectric.

6. The semiconductor structure of claim 1, wherein the EM monitor further comprises a second EM wire separated from the perimeter sidewall of the through VIA by the dielectric.

7. The semiconductor structure of claim 6, wherein a first distance from the perimeter sidewall of the through VIA to the first EM wire and a second distance from the perimeter sidewall of the through VIA to the second EM wire are the same.

8. The semiconductor structure of claim 6, wherein a first distance from the perimeter sidewall of the through VIA to the first EM wire is greater than a second distance from the perimeter sidewall of the through VIA to the second EM wire.

9. The semiconductor structure of claim 1, wherein the first EM wire is circularly arranged about the perimeter of the through VIA.

10. The semiconductor structure of claim 1, wherein the first EM wire is orthogonally arranged about the perimeter of the through VIA.

11. The semiconductor structure of claim 1, wherein the first EM wire comprises a first section that has a larger cross sectional area relative to a second section of the first EM wire.

12. The semiconductor structure of claim 1, wherein the first EM wire comprises a first portion in a first wiring level electrically connected by a via to a second portion in a second wiring level.

* * * * *